US010014295B2

(12) United States Patent
Ok et al.

(10) Patent No.: US 10,014,295 B2
(45) Date of Patent: Jul. 3, 2018

(54) SELF HEATING REDUCTION FOR ANALOG RADIO FREQUENCY (RF) DEVICE (71) Applicant: International Business Machines Corporation, Armonk, NY (US)

(72) Inventors: Injo Ok, Loudonville, NY (US); Balasubramanian Pranatharthiharan, Watervliet, NY (US); Charan V. Surisetty, Clifton Park, NY (US); Soon-Cheon Seo, Glenmont, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/344,256

(22) Filed: Nov. 4, 2016

(65) Prior Publication Data

US 2017/0162567 A1 Jun. 8, 2017

Related U.S. Application Data (62) Division of application No. 14/961,372, filed on Dec. 7, 2015, now Pat. No. 9,520,500.

(51) Int. Cl.
*H01L 29/76* (2006.01)
*H01L 27/088* (2006.01)
*H01L 29/06* (2006.01)

(52) U.S. Cl.
CPC ...... *H01L 27/0886* (2013.01); *H01L 29/0649* (2013.01)

(58) Field of Classification Search
CPC ............. H01L 27/0886; H01L 29/0649; H01L 29/66553; H01L 29/66795; H01L 29/785
USPC ........................................................ 257/288
See application file for complete search history.

(56) References Cited

U.S. PATENT DOCUMENTS

| 7,973,389 | B2 | 7/2011 | Rios et al. |
| 8,785,284 | B1 | 7/2014 | Bergendahl et al. |
| 2006/0163662 | A1* | 7/2006 | Kinoshita ......... H01L 21/28097 257/369 |
| 2009/0008705 | A1 | 1/2009 | Zhu |
| 2010/0197096 | A1* | 8/2010 | Johnson ......... H01L 21/823431 438/268 |

(Continued)

OTHER PUBLICATIONS

List of IBM Patents or Patent Applications Treated as Related Dated Nov. 4, 2016, 2 Pages.

*Primary Examiner* — Duy T Nguyen
(74) *Attorney, Agent, or Firm* — Scully, Scott, Murphy & Presser, P.C.; Steven J. Meyers (57) ABSTRACT

A method of forming a semiconductor device includes forming a plurality of semiconductor fins from an upper semiconductor layer located on a first region of a bulk semiconductor substrate of a structure and then forming at least one gate structure straddling a portion of semiconductor fins. A portion of the lower semiconductor layer from beneath the upper semiconductor layer is then removed to form a vertical semiconductor portion which contacts the bulk semiconductor substrate and at least one of the semiconductor fins. A dielectric layer (e.g., a spacer layer) is then deposited over the structure and laterally surrounds the vertical semiconductor portion such that semiconductor fins and the at least one gate structure are partially isolated from the first region of the bulk semiconductor substrate by the dielectric layer.

14 Claims, 6 Drawing Sheets

(56) References Cited

U.S. PATENT DOCUMENTS

2013/0244387 A1 9/2013 Cho
2013/0316513 A1 11/2013 Basker et al.

* cited by examiner

SELF HEATING REDUCTION FOR ANALOG RADIO FREQUENCY (RF) DEVICE

CROSS REFERENCE TO RELATED APPLICATIONS

The present application is a divisional of U.S. Ser. No 14/961,372, now U.S. Pat. No. 9,520,500, the entire content and disclosure of which is incorporated herein by reference.

BACKGROUND

The present application relates to semiconductor technology, and more particularly to self heating reduction for analog RF devices for a dielectrically isolated bulk field effect transistor (FinFET).

Typically, silicon on insulator (SOI) devices cause a self heating effect on analog RF devices because there is a high current input and output generated by the gate structures of the analog RF devices such that there is a need to dissipate the heat buildup. Moreover, although conventional bulk FinFET devices reduce the self heating effect, these devices may have issues with channel and junction isolation. In addition, with conventional bulk FinFETs, the variability in fin height and width is significantly greater than the height and width variability in SOI FinFETS.

SUMMARY

In accordance with an exemplary embodiment of the present disclosure, a method of forming a semiconductor device is provided. The method includes etching a first upper semiconductor layer of a first structure including a bulk semiconductor substrate, a first lower semiconductor layer located on a top surface of a first region of the bulk semiconductor substrate, and the first upper semiconductor layer located on a top surface of the first lower semiconductor layer to form a first plurality of semiconductor fins spaced apart from each other on the top surface of the first lower semiconductor layer. The method further includes forming at least one first region gate structure straddling over a portion of the first plurality of semiconductor fins at a location between a first end and a second end of the first plurality of semiconductor fins, and removing the first lower semiconductor layer from the first structure except for a portion of the first lower semiconductor layer located beneath a portion of at least one of the first plurality of semiconductor fins that is overlapped by the at least one first region gate structure to form a first region space in the first structure. The remaining unetched portion of the first lower semiconductor layer contacts the bulk semiconductor substrate and at least one of the first plurality of semiconductor fins.

In addition, the method of the exemplary embodiment of the present disclosure further includes depositing a first dielectric layer on the first structure filling in the first region space, wherein the first dielectric layer laterally surrounds the remaining unetched portion of the first lower semiconductor layer in the first region space such that the at least one first region gate structure and the first plurality of semiconductor fins are partially isolated from the first region of the bulk semiconductor substrate.

In accordance with another exemplary embodiment of the present disclosure, a semiconductor device is provided. The semiconductor device includes a first semiconductor structure including a first plurality of semiconductor fins spaced apart from each other on a first region of a bulk semiconductor substrate, at least one first region gate structure straddling over a portion of the first plurality of semiconductor fins located in between a first end and a second end of the first plurality of semiconductor fins, and at least one vertical semiconductor material portion located in a first region space between a top surface of the first region of the bulk semiconductor substrate and a bottom surface of the first plurality of semiconductor fins and a bottom surface of the at least one first region gate structure. The at least one vertical semiconductor material portion contacts the bottom surface of at least one of the first plurality of semiconductor fins and the top surface of the first region of the bulk semiconductor substrate providing a heat dissipation path from the at least one first region gate structure and the at least one of the first plurality of semiconductor fins to the first region of the bulk semiconductor substrate.

The semiconductor device of the another exemplary embodiment further includes a first dielectric layer filling in the first region space and laterally surrounding the at least one vertical semiconductor material portion in the first region space such that the first plurality of semiconductor fins and the at least one first region gate structure are partially isolated from the bulk semiconductor substrate by the first dielectric layer, and a first gate spacer located on opposing sidewalls of the at least one first region gate structure.

In accordance with still another exemplary embodiment of the present disclosure, a method for forming a semiconductor device is provided. The method includes epitaxially growing a first lower semiconductor layer on a top surface of a first region of a bulk semiconductor substrate, epitaxially growing a first upper semiconductor layer on a top surface of the first lower semiconductor layer located on the first region of the bulk semiconductor substrate to form a first region first intermediate structure, etching the first upper semiconductor layer to form a first plurality of semiconductor fins spaced apart from each other on the top surface of the first lower semiconductor layer to transform the first region first intermediate structure into a first region second intermediate structure, and forming a first shallow trench isolation (STI) trench and a second STI trench on opposing sides of the first region second intermediate structure as one another to transform the first region second intermediate structure into a first region third intermediate structure. The method further includes forming a plurality of first region gate structures straddling over a portion of each of the first plurality of semiconductor fins at a location in between a first end and a second end of each of the first plurality of semiconductor fins of the first region third intermediate structure to transform the first region third intermediate structure into a first region fourth intermediate structure.

In addition, the method of the still another exemplary embodiment of the present disclosure further includes partially etching the first lower semiconductor layer from the first region fourth intermediate structure to form a first region space beneath the first plurality of semiconductor fins and beneath the plurality of first region gate structures, and to form at least one vertical pillar formed of the remaining unetched portions of the first region first semiconductor layer located in a portion of the first region space to transform the first region fourth intermediate structure into a first region fifth intermediate structure. The at least one vertical pillar has a same height as the first region space and contacts a top surface of the first region of the bulk semiconductor substrate and a bottom surface of the first plurality of semiconductor fins.

Further, the method of the still another exemplary embodiment of the present disclosure further includes forming a first spacer layer including a dielectric material on sidewalls of the plurality of first region gate structures and filling in the first region space of the first region fifth intermediate structure such that a portion of the first spacer layer located in the first region space laterally surrounds the at least one vertical pillar and partially isolates the second region of the bulk semiconductor substrate from the second plurality of semiconductor fins and the second region gate structures. The at least one vertical pillar provides a heat dissipation path from the first region gate structures and the first plurality of semiconductor fins to the first region of the bulk semiconductor substrate.

DETAILED DESCRIPTION

Referring to FIGS. 1-11, there is shown a method of fabricating a first semiconductor structure 1000 and a second semiconductor structure 1000' from a same bulk semiconductor substrate 10 of a semiconductor wafer in accordance with an embodiment of the present application. The first semiconductor structure 1000 is formed from a first region 1 of the bulk semiconductor substrate 10, and the second semiconductor structure 1000' is formed from a second region 2 of the bulk semiconductor substrate 10. It is noted that alternatively, and in other embodiments, the first semiconductor structure 1000 may instead be formed from the second region 2 of the bulk semiconductor substrate 10, and the second semiconductor structure 1000' may instead be formed from the first region 1 of the bulk semiconductor substrate 10.

The first semiconductor structure 1000 and the second semiconductor structure 1000' have substantially identical structures to one another, except for some differences mentioned below. One of the differences between the first semiconductor structure 1000 and the second semiconductor structure 1000' is that the second semiconductor structure 1000' has gate structures having greater widths than the widths of the gate structures of the first semiconductor structure 1000. Another difference between the first semiconductor structure 1000 and the second semiconductor structure 1000' is that in the first semiconductor structure 1000, the semiconductor fins and the gate structures are fully isolated from the bulk semiconductor substrate 10 by a dielectric material (e.g. a spacer layer) located in a space beneath the semiconductor fins and the gate structures, whereas in the second semiconductor structure 1000', the semiconductor fins and the gate structures are only partially isolated from the bulk semiconductor substrate 10 by the dielectric material (e.g. spacer layer) located in the space beneath the semiconductor fins and the gate structures. The semiconductor fins and the gate structures are only partially isolated from the bulk semiconductor substrate 10 by the dielectric material (e.g. spacer layer) because the second semiconductor structure further includes a vertical semiconductor portion (e.g., vertical pillar) located in the space beneath the gate structures and semiconductor fins such that dielectric layer does not fully fill the space. The vertical pillar provides a heat sink path for dissipating heat generated by the gate structures and the semiconductor fins to the bulk semiconductor substrate 10.

The first semiconductor structure 1000 may subsequently be used to form a first device such as for example, an SRAM or logic device. The second semiconductor structure 1000' may then subsequently be used to form a second device such as for example, an analog radio frequency (RF) device.

Figure 1:
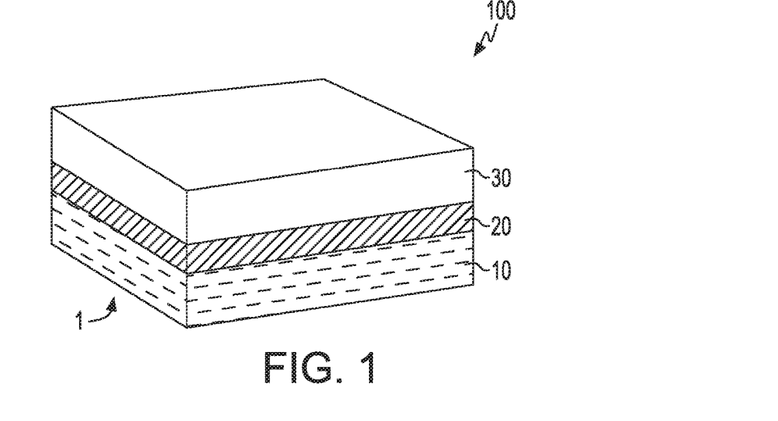
FIG. 1 is a perspective view of a first region first intermediate structure used in the forming of a first semiconductor structure of an exemplary embodiment of the present disclosure.

Referring first to FIG. 1, a first region first intermediate structure 100 used in the process of forming the first semiconductor structure 1000 is provided. In the present embodiment, the first region first intermediate structure 100 includes, a bulk semiconductor substrate 10. The bulk semiconductor structure 10 has a first region 1 (See FIG. 1) and a second region 2 (See FIGS. 8-11). The first region intermediate structure 100 includes the first region 1 of the bulk semiconductor substrate 10. The second region 2 of the bulk semiconductor substrate 10 is included as part of a second region first intermediate structure (not shown) used to form the second semiconductor structure 1000' discussed later in connection with FIGS. 8-11.

Referring back to FIG. 1, a first semiconductor layer or lower semiconductor layer 20 (first semiconductor layer and lower semiconductor layer are used interchangeably throughout to refer to the same element) is formed, for example, by an epitaxial growth process on a top surface of the bulk semiconductor substrate 10 on the first region 1 of the bulk semiconductor substrate 10. Next, a second semiconductor layer or upper semiconductor layer 30 (second semiconductor layer and upper semiconductor layer are used interchangeably throughout to refer to the same element) is also formed, by for example, an epitaxial growth process on a top surface of the first semiconductor layer 20 located on the first region 1 of the bulk semiconductor substrate 10 to form the first region first intermediate structure 100 illustrated in FIG. 1.

In the present embodiment, a first semiconductor layer 20 and a second semiconductor layer 30 are also formed by an epitaxial growth process on the top surface of the bulk semiconductor substrate 10 on the second region 2 of the bulk semiconductor substrate 10 to form a second region first intermediate structure (not shown) in a same manner as used to form the first region first intermediate structure 100 illustrated in FIG. 1 The second region first intermediate structure is used to form the second semiconductor structure 1000' discussed in connection with FIGS. 8-11.

Alternatively, and in other embodiments, the first semiconductor structure 1000 and the second semiconductor structure 1000' may be formed from separate substrates from one another.

The bulk semiconductor substrate 10 may be formed of any semiconductor material. For example, the semiconductor material of the bulk semiconductor substrate 10 can include silicon (Si), germanium (Ge), silicon germanium (SiGe), silicon germanium carbide (SiGeC), silicon carbide (SiC), an III-V compound semiconductor, an II-VI compound semiconductor or any combinations thereof. In the present embodiment, the bulk semiconductor substrate 10 includes silicon. The semiconductor material need not be doped, although it may be very lightly doped as either N-type or P-type, without impacting the manufacturing process described herein. P-type dopant refers to the addition of an impurity to the bulk semiconductor substrate 10 to create deficiencies of valence electrons. Examples of a P-type dopant include boron, aluminum, gallium or indium, any one or more of which may be added to the bulk semiconductor substrate 10. The N-type dopant refers to the addition of impurities to the bulk semiconductor substrate 10 which contribute more electrons to the semiconductor material (e.g., silicon) of the bulk semiconductor substrate 10, and may include (for instance) phosphorus, antimony or arsenic. By "lightly doped" it is meant a dopant concentration which may be, for example, less than, or equal to, $10^{16}$ $cm^{-3}$.

The first semiconductor layer 20 includes a semiconductor material, such as, for example, silicon germanium (SiGe) or indium phosphide (InP). Further, the second semiconductor layer 30 includes a semiconductor material such as, for example, silicon.

Figure 2:
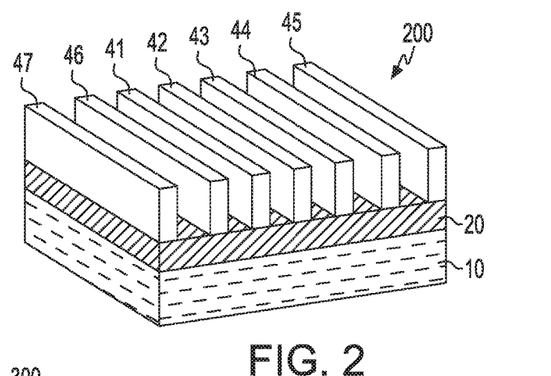
FIG. 2 is a perspective view of a first region second intermediate structure used in the forming of the first semiconductor structure.

Referring to FIG. 2, the second semiconductor layer 30 of the first region first intermediate structure 100 may then be patterned using, for example, conventional lithography and etching techniques to form a first semiconductor fin 41, a second semiconductor fin 42, a third semiconductor fin 43, a fourth semiconductor fin 44, a fifth semiconductor fin 45, a sixth semiconductor fin 46, and a seventh semiconductor 47 spaced apart from each other on the top surface of the first semiconductor layer 20 transforming the first region first intermediate structure 100 into a first region second intermediate structure 200. In an embodiment, a photoresist layer (not shown) may deposited on the top surface of the second semiconductor layer 30 and then may be developed to form a photoresist (not shown) on the second semiconductor layer 30. The second semiconductor layer 30 may then be etched, for example, using the photoresist as an etching mask in a dry etching process to form the first, second, third, fourth, fifth, sixth and seventh semiconductor fins 41, 42, 43, 44, 45, 46, 47 spaced apart from each other on the top surface of the first semiconductor layer 20. The dry etching process may include, for example, a reactive ion etching (RIE) process or a double patterning process. In the present embodiment, an RIE process is used to form the first, second, third, fourth, fifth, sixth and seventh semiconductor fins 41, 42, 43, 44, 45, 46, 47. In some embodiments, the semiconductor fin patterning can be formed utilizing a sidewall image transfer (SIT) process as is well known in the art. In other embodiments, the semiconductor fin patterning can be achieved using single exposure using extreme ultra-violet (EUV) or e-beam technique or multiple deep ultra-violet (DUV) exposure and RIE.

As noted above, there are seven semiconductor fins 41, 42, 43, 44, 45, 46, 47 formed as a result of the above etching step of the present embodiment but exemplary embodiments of the present disclosure are not limited thereto. Alternatively, and in other embodiments, more than seven semiconductor fins or less than seven semiconductor fins may be formed.

Figure 3:
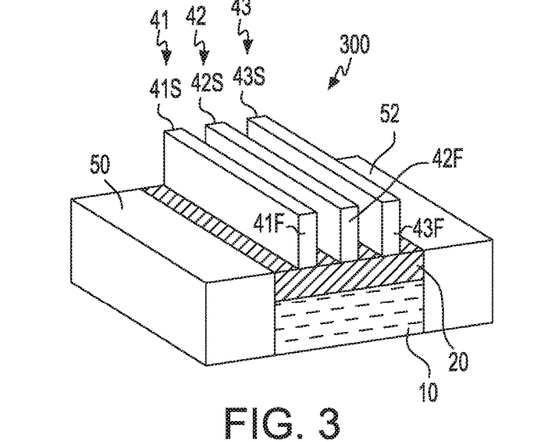
FIG. 3 is a perspective view of a first region third intermediate structure used in the forming of the first semiconductor structure.

Referring to FIG. 3, an etching process such as, for example, an RIE process is then performed on the first region second intermediate structure 200 to remove some of the semiconductor fins to form shallow trench isolation (STI) structures as explained in further detail hereinafter. The semiconductor fins being removed in the present embodiment are known as sacrificial semiconductor fins, as explained below in further detail. For example, and in the present embodiment, there are four sacrificial semiconductor fins (e.g., the fourth semiconductor fin 44, the fifth semiconductor fin 45, the sixth semiconductor fin 46, and the seventh semiconductor fin 47) which are each removed by an RIE process, such that only the first, second and third semiconductor fins 41, 42, 43 remain on the top surface of the first semiconductor layer 20. However, exemplary embodiments of the present application are not limited thereto. Alternatively, and in other embodiments more than three semiconductor fins or less than three semiconductor fins may be left after the above sacrificial semiconductor fin removal process.

Also, the above-mentioned etch process not only removes the fourth, fifth, sixth and seventh semiconductor fins 44, 45, 46, 47 but also removes the portions of the first semiconductor layer 20 and the bulk semiconductor substrate 10 located beneath the fourth, fifth, sixth, seventh semiconductor fins 41, 42, 43, 44, 45, 46, 47 to form a first trench (not shown) on one side of the etched first region second intermediate structure 200 and a second trench (not shown) on an opposing side of the etched first region second intermediate structure 200.

The first and second trenches are then filled with, for example, a dielectric material such as a dielectric oxide material by performing, for example, an STI process. In the present embodiment, the dielectric material used to fill the first and second trenches on the opposing sides of the etched first region second intermediate structure 200 is, for example, silicon oxide. Next, an etch back process can be performed on the dielectric material located in the first and second trenches such that an upper surface of the dielectric electric material in each of the first and second trenches is substantially co-planar with a height of the upper surface of the first semiconductor layer 20 of the etched first region second semiconductor structure 200. The first and second trenches filled with the dielectric material are now referred to as a first STI trench 50 and a second STI trench 52, transforming the first region second intermediate structure 200 into a first region third intermediate structure 300 illustrated in FIG. 3. As illustrated in FIG. 3, the first semiconductor fin 41 has a first end 41F and a second end 41S, the second semiconductor fin 42 has a first end 42F and a second end 42S, and the third semiconductor fin 43 has a first end 43F and a second end 43S.

Figure 4A:
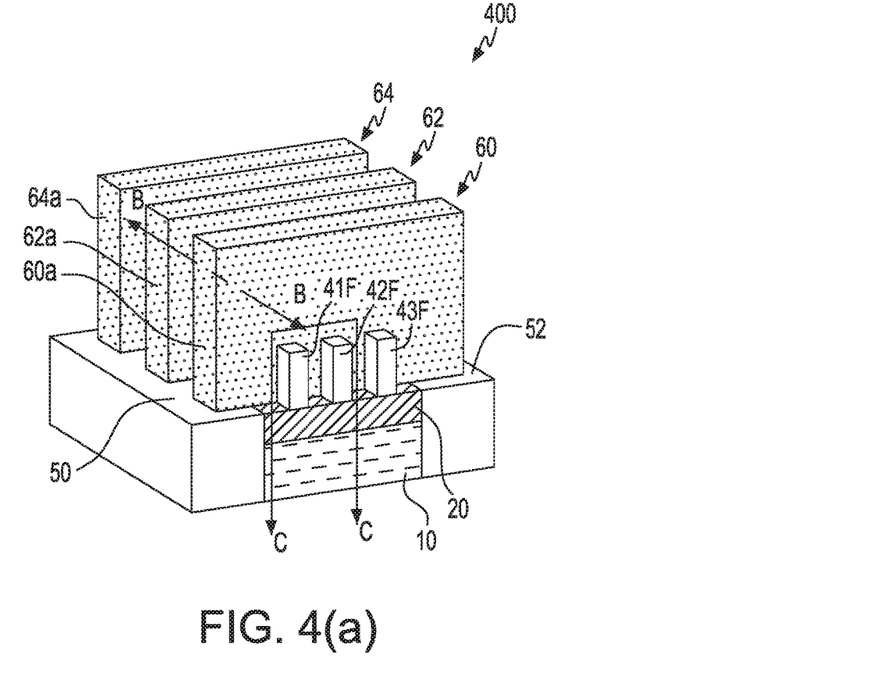
FIG. 4(a) is a perspective view of a first region fourth intermediate structure used in the forming of the first semiconductor structure.
Figure 4B:
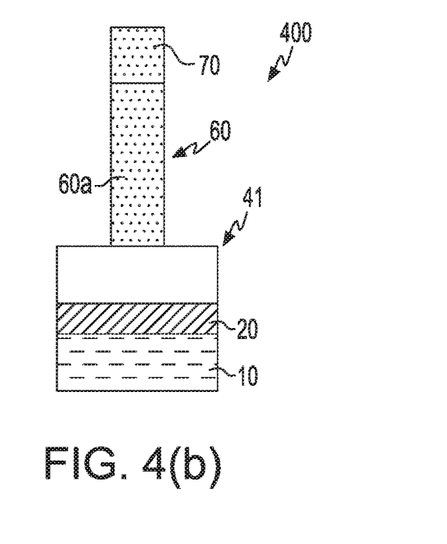
FIG. 4(b) is a cross-sectional view taken along line B-B through a first semiconductor fin and a first gate structure straddling the first semiconductor fin of the first region fourth intermediate structure of FIG. 4(a)
Figure 4C:
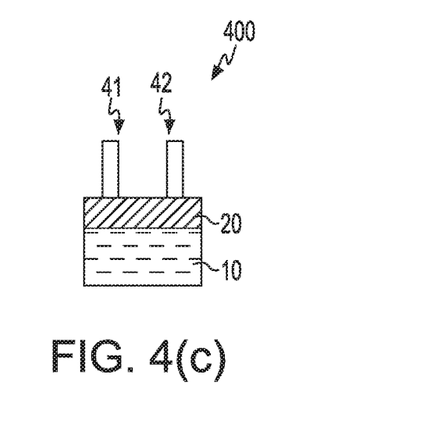
FIG. 4(c) is a cross-sectional view taken along line C-C through the first semiconductor fin and a second semiconductor fin of the first region fourth intermediate structure of FIG. 4(a) in a region outside of gate structures.

Processes are then performed on the first region third intermediate structure 300 illustrated in FIG. 3 to form a first gate structure 60, a second gate structure 62 and a third gate structure 64 each straddling the top surface and opposing sidewalls of a portion of each of the first, second and third semiconductor fins 41, 42, 43 at a location in between the first end 41 F, 42, F, 43F and the second end 41S, 42S, 43S of each of the first, second and third semiconductor fins 41, 42, 43 transforming the first region third intermediate structure 300 into a first region fourth intermediate structure 400 as illustrated in FIGS. 4(a)-4(c). The lengthwise direction of the first, second, and third gate structures 60, 62, 64 is substantially perpendicular to a lengthwise direction of the first, second and third semiconductor fins 41, 42, 43.

Specifically, as shown in FIG. 4(a), the first, second and third gate structures 60, 62, 64 also contact a portion of the top surfaces of the first semiconductor layer 20 located on each side of the first semiconductor fin 41, the second semiconductor fin 42, and the third semiconductor fin 43, and contact portions of the top surface of each of the first STI trench 50 and the second STI trench 52. In the present embodiment, there are three gate structures but exemplary embodiments are not limited to any particular number of gate structures. Alternatively, and in other exemplary embodiments, there may be only one or two gate structures.

The first gate structure 60 includes a stack of a first gate dielectric layer (not shown) and a first gate electrode 60a located on the first gate dielectric layer, and the second gate structure 62 includes a stack of a second gate dielectric layer (not shown) and a second gate electrode 62a located on the second gate dielectric layer. In addition, the third gate structure 64 includes a stack of a third gate dielectric layer (not shown) and a third gate electrode 64a located on the third gate dielectric layer. The first, second and third gate dielectric layers may be formed of, for example, a silicon-oxide based dielectric material such as silicon oxide, silicon oxynitride, silicon nitride, and/or a dielectric metal oxide having a dielectric constant greater than 8.0 (i.e., a high dielectric material). The first, second and third gate electrodes 60a, 62a, 64a may be formed from, for example, a gate conductor material such as polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials.

The first, second and third gate structures 60, 62, 64 may be formed by, for example, sequentially depositing a gate dielectric layer and a gate electrode layer on the first, second and third semiconductor fins 41, 42, 43 and on the first and second STI trenches 50 and 52 of the first region third intermediate structure 300. The gate dielectric layer and the gate electrode layer may be deposited by processes such as, for example, chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. After depositing the gate dielectric layer and the gate electrode layer, CMP (chemical mechanical polishing) is performed to planarize the gate electrode layer and then a hard mask layer can be deposited on the gate electrode layer and then the hard mask layer may be patterned using, for example, single exposure EUV or e-beam, multiple exposure using DUV conventional or advanced lithographic and etching processes or SIT (Sidewall Image Transfer) patterning technique known in the art to form a first hard mask 70, a second hard mask 72 and a third hard mask 74 on the gate electrode layer. The hard mask layer may be formed of any suitable material such as, for example, silicon nitride, silicon oxynitride (SiON), silicon carbide (SiC), silicon oxycarbide (SiOC), spin-on glass (SOG), a low-k film, tetraethylorthosilicate (TEOS), plasma enhanced CVD oxide (PE-oxide), high-aspect-ratio-process (HARP) formed oxide, and/or other suitable material.

The etching process for forming the first, second and third hard masks 70, 72, 74 may include, for example, one of the following of dry etching (e.g., a RIE process) and wet etching. In the present embodiment, an RIE process is used to form the first, second and third hard masks 70, 72, 74.

The first, second and third hard masks 70, 72, 74 may then be used as an etch mask in, for example, an RIE etching process to etch the gate electrode layer and the gate dielectric layer to form the first, second and third gate structures 60, 62, 64 at the locations discussed above to transform the first region third intermediate structure 300 into a first region fourth intermediate structure 40 as illustrated in FIGS. 4(a)-(c). The first, second and third gate structures 60, 62, 64 in the present embodiment each have a gate width of, for example, 5 nm to 100 nm.

Figure 7A:
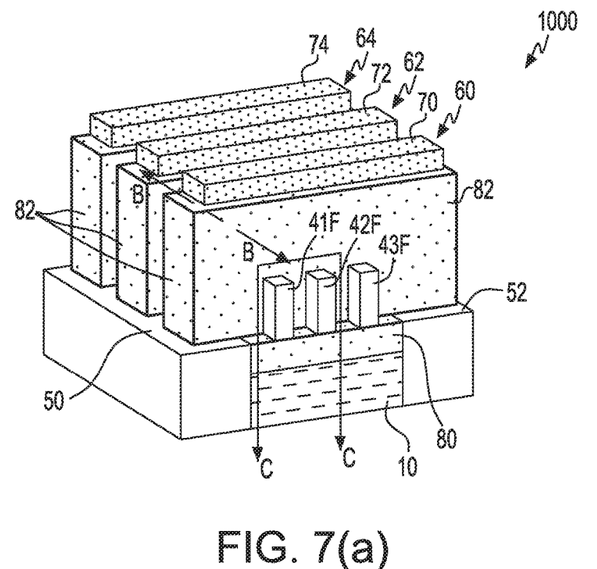
FIG. 7(a) illustrates a perspective view of the first semiconductor structure.

The first hard mask 70 is located on a top surface of the first gate structure 60 (e.g., the top surface of the first gate electrode 60a), the second hard mask 72 is located on a top surface of the second gate structure 62 (e.g., the top surface of the second gate electrode 62a), and the third hard mask layer 74 is located on a top surface of the third gate structure 64 (e.g., the top surface of the third gate electrode 64a) of the first region fourth intermediate structure 400, although the drawings only illustrate the first hard mask 70 located on the top surface of the first gate structure 60 in connection with the first region fourth intermediate structure 400 (see e.g., FIG. 4(b). Moreover, the first, second and third hard masks 70, 72, 74 remain on the first, second and the third gate structures 60, 62, 64, respectively, throughout the subsequent process steps and are part of the first semiconductor structure 1000 formed as shown in FIG. 7(a) and as discussed in further detail hereinafter.

Referring specifically to FIG. 4(a), in the first region fourth intermediate structure 400, the first semiconductor layer 20 fills in substantially the entire area located between the top surface of the bulk semiconductor substrate 10 in the first region 1 and the bottom surfaces of the first, second and third semiconductor fins 41, 42 and 43 and the bottom surfaces of the first, second and third gate structures 60, 62, 64 such that the first, second and third semiconductor fins 41, 42, 43 and the first, second and third gate structures 60, 62, 64 are each prevented from making direct physical contact with the first region 1 of the bulk semiconductor substrate 10 by the intervening first semiconductor layer 20. In other words and in the first region fourth intermediate structure 400, the top surface of the first semiconductor layer 20 is in direct physical contact with substantially the entire bottom surface of each of the first, second and third semiconductor fins 41, 42, 43 and substantially the entire bottommost surfaces of portions of each of the first, second and third gate structures 60, 62, 64 located in the active region of the first region fourth intermediate structure 400, and the bottom surface of the first semiconductor layer 20 is also in direct physical contact with substantially the entire top surface of the first region 1 of the bulk semiconductor substrate 10. The active region is defined herein as the entire area of the first region fourth intermediate structure 400 that is located in between the first and second STI trenches 50 and 52.

Discussed below are some cross-sectional views of the first region fourth intermediate structure 400 of FIG. 4(a) shown in FIGS. 4(b) and 4(c) to further illustrate the first semiconductor layer filling in substantially the entire area beneath the semiconductor fins and the gate structures. It is noted that not all of the semiconductor fins and the gate structures illustrated in FIG. 4(a) are shown in these cross-sectional views illustrated in FIGS. 4(b) and 4(c) for the sake of brevity.

For example, FIG. 4(b) illustrates a cross-sectional view taken along line B-B (lengthwise direction of semiconductor fins) through the first semiconductor fin 41 and the first gate structure 60 straddling the first semiconductor fin 41 of the first region fourth intermediate structure 400 of FIG. 4(a). As shown in FIG. 4(b), along the B-B direction the first semiconductor layer 20 fills in substantially the entire area between a portion of the top surface of the first region 1 of the bulk semiconductor substrate 10 and the bottom surface of the portion of the first semiconductor fin 41 straddled by the first gate structure 60, and the first semiconductor layer 20 also fills in substantially the entire area between a portion of the top surface of the first region 1 of the bulk semiconductor substrate 10 and portions of the first semiconductor fin 41 not straddled by the first gate structure 60. Moreover, the first semiconductor layer 20 also fills in substantially the entire area between a portion of the top surface of the first region 1 of the bulk semiconductor substrate 10 and the bottommost surface of the portions of the first gate structure 60 straddling the first semiconductor fin 41 in the active region along the line B-B direction, as shown in FIG. 4(b).

Although not shown in a cross-sectional view of the drawings for the sake of brevity, as discussed the first semiconductor layer 20 also fills in substantially the entire area between a portion of the top surface of the first region 1 of the bulk semiconductor substrate 10 and the bottom surface of the portions of the second and third semiconductor fins 42, 43 straddled by the first gate structure 60 along the lengthwise direction of the second and third semiconductor fins 42, 43 straddled by the first gate structure 60 in the same manner as illustrated in FIG. 4(b) in connection with the first semiconductor fin 41. In addition, the first semiconductor layer 20 also fills in substantially the entire area between a portion of the top surface of the first region 1 of the bulk semiconductor substrate 10 and the portions of the second and third semiconductor fins 42, 43 not straddled by the first gate structure 60 along the lengthwise direction of the second and third semiconductor fins 42, 43 in the same manner as illustrated in FIG. 4(b) in connection with the first semiconductor fin 41. Moreover, the first semiconductor layer 20 also fills in substantially the entire area between a portion of the top surface of the first region 1 of the bulk semiconductor substrate 10 and the bottommost surface of the portions of the first gate structure 60 straddling the second and third semiconductor fins 42, 43 in the active region of the first region fourth intermediate structure 400 along the lengthwise direction of the second and third semiconductor fins 42, 43 in the same manner as shown in FIG. 4(b).

Further, the first semiconductor layer 20 also fills in substantially the entire area beneath the portions of the second and third gate structures 62, 64 in the active region, beneath the portions of the first, second and third semiconductor fins 41, 42, 43 straddled by the second and third gate structures 62, 64 and beneath the portions of the first, second and third semiconductor fins 41, 42, 43 not straddled by the second and third gate structures 62, 64 in the same direction and the same manner as illustrated in FIG. 4(b).

Referring to FIG. 4(c), this figure illustrates a cross-sectional view taken along line C-C (widthwise direction of the first and second semiconductor fins 41 42) through the first semiconductor fin 41 and the second semiconductor fin 42 of the first region fourth intermediate structure 400 of FIG. 4(a) in a region outside of the gate structures. As shown in FIG. 4 (c), the first semiconductor layer 20 fills in substantially the entire area between a portion of the top surface of the bulk semiconductor substrate 10 and the bottom surfaces of the first and second semiconductor fins 41, 42 along the C-C direction. The view depicted in FIG. 4(c) for the purpose of illustration is taken along the first end 41F, 42F of the first and second semiconductor fins 41, 42.

Alternatively, the view in FIG. 4(c) could also represent the same cross-sectional view taken along the widthwise direction of the first and second semiconductor fins 41 42 through the second end 41S, 42S of the first and second semiconductor fins 41 42. Further, the view in FIG. 4(c), could alternatively represent the same cross-sectional view taken along the widthwise direction of a portion of the first, second and third semiconductor fins 41, 42, 43 located in between the first and second gate structures 60, 62 or in between the second and third gate structures 62, 64. In sum, the view in FIG. 4(c) could represent a cross-sectional view taken along the widthwise direction of any portion of the first, second and third semiconductor fins 41, 42, 43 which is located outside of the first, second or third gate structures 60, 62, 64. Thus, the first semiconductor layer 20 fills in substantially the entire area between a portion of the top surface of the first region of the bulk semiconductor substrate 10 and the portions of the bottom surface of the first, second and third semiconductor fins 41, 42, 43 located outside of the first, second and third gate structures 60, 62, 64 along the widthwise directions of the first, second and third semiconductor fins 41, 42, 43 in the same manner as illustrated in FIG. 4(*c*).

Figure 5A:
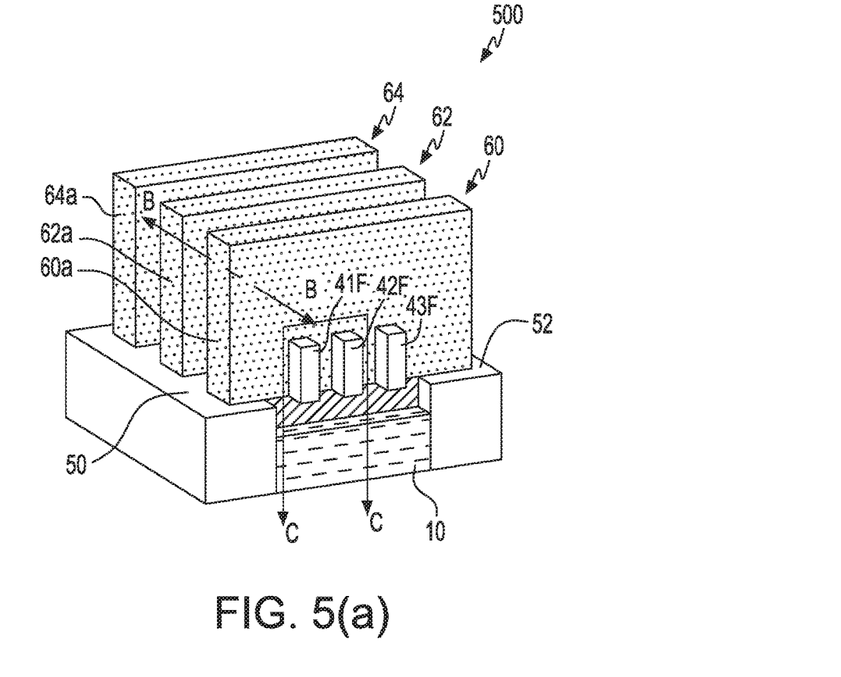
FIG. 5(a) is a perspective view of a first region fifth intermediate structure used in the forming of the first semiconductor structure.
Figure 5B:
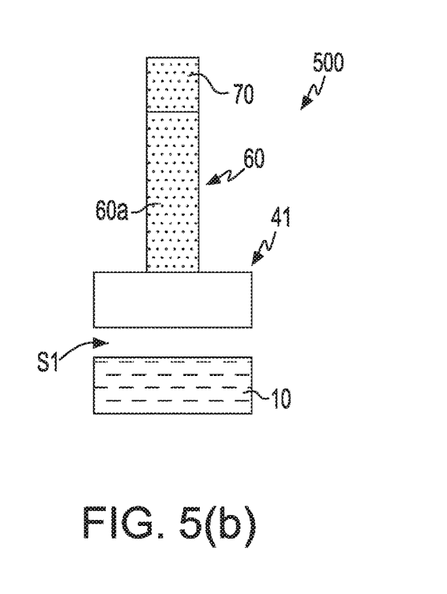
FIG. 5(b) illustrates a cross-sectional view taken along line B-B through the first semiconductor fin and the first gate structure straddling the first semiconductor fin of the first region fifth intermediate structure of FIG. 5(a).
Figure 5C:
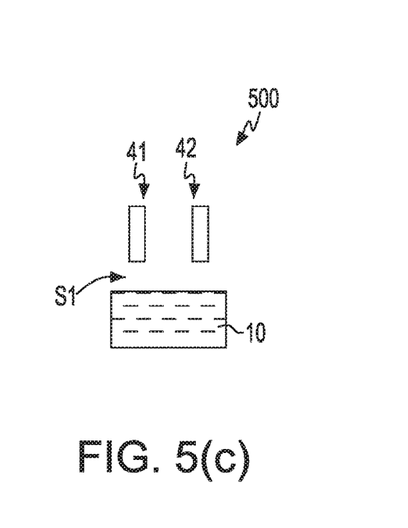
FIG. 5(c) illustrates a cross-sectional view taken along line C-C through the first and second semiconductor fins of the first region fifth intermediate structure of FIG. 5(a) in a region outside of the gate structures.

An etching process is then performed on the first region fourth intermediate structure 400 to remove substantially the entire first semiconductor layer 20 from the first region fourth intermediate structure 400 to transform the first region fourth intermediate structure 400 into a first region fifth intermediate structure 500 illustrated in FIGS. 5(*a*)-(*c*). The etching process used to etch the first semiconductor layer 20 may include, for example, an RIE process using an HCl-based etchant gas or a wet process using HF-based wet chemistry. The views illustrated in FIGS. 5(*a*)-(*c*) of the first region fifth intermediate structure 500 correspond to the same directional views of the first region fourth intermediate structure 400 illustrated in FIGS. 4(*a*)-(*c*), respectively.

Although FIG. 5(*a*) illustrates that some of the first semiconductor layer 20 still remains unetched in the first region intermediate structure 500, it is noted however the entire first semiconductor layer 20 has been completely removed from the first region fourth intermediate structure 400 by the above-mentioned etching process prior to the formation of the first region fifth intermediate structure 500 such that none of the first semiconductor layer 20 remains in the first region fifth intermediate structure 500. Consequently, as a result of the above RIE etching process removing substantially the entire first semiconductor layer 20, the first region fifth intermediate structure 500 is formed which includes a first region space S1 that occupies the entire area previously occupied by the first semiconductor layer 20 beneath each of the first, second and third semiconductor fins 41, 42, 43 and beneath the portions of each of the first, second and third gate structures 60, 62, 64 in the active region of the first region fourth intermediate structure 400.

A spacer layer or dielectric layer 80 is then formed on the first region fifth intermediate structure 500 to transform the first region fifth intermediate structure 500 into a first region sixth intermediate structure 600 illustrated in FIGS. 6(*a*)-(*c*), in the manner explained below. The views illustrated in FIGS. 6(*a*)-(*c*) of the first region sixth intermediate structure 600 correspond to the same directional views of the first region fifth intermediate structure 500 illustrated in 5(*a*)-5(*c*), respectively and the first region fourth intermediate structure 400 illustrated in FIGS. 4(*a*)-(*c*), respectively.

In particular, the spacer layer 80 is formed over the top surfaces and the sidewalls of each of the first, second and third hard masks 70, 72, 74, the top surfaces and the sidewalls of each of the first, second and third gate structures 60, 62, 64 and on the top surfaces and the sidewalls of each of the first, second and third semiconductor fins 41, 42, 43 of the first region fifth intermediate structure 500. In addition, the spacer layer 80 is also formed to fill the entire first region space S1 in the first region fifth intermediate structure 500 located below the first, second and third semiconductor fins 41, 42, 43 and below the first, second and third gate structures 60, 62, 64 in the active region to transform the first region fifth intermediate structure into a first region sixth intermediate structure 600 shown in FIGS. 6(*c*)-(*c*).

The spacer layer 80 is in direct physical contact with all portions of the first, second and third semiconductor 41, 42, 43 in first region sixth intermediate structure 600, except for the those portions of the first, second and third semiconductor fins 41, 42, 43 which are straddled by the first, second and the third gate structures 60, 62, 64. Moreover, the spacer layer 80 is in direct physical contact with all of the portions of the bottommost surfaces of the first, second and third gate structures 60, 62, 64 in the active region of the first region sixth intermediate structure 600.

Specifically in the first region sixth intermediate structure 600, the first region 1 of the bulk semiconductor substrate 10 is completely isolated from the first, second and third semiconductor fins 41, 42, 43 and from the first, second and third gate structures 60, 62, 64 by the spacer layer 80. In other words, the spacer layer 80 filling in substantially the entire first region space S1 of the first region sixth intermediate structure 600 prevents the first, second and third semiconductor fins 41, 42, 43 and the first, second and third gate structures 60, 62, 64 from making direct physical contact with the first region 1 of the bulk semiconductor substrate 10.

The spacer layer 80 may be formed using, for example, a chemical vapor deposition (CVD) or an atomic layer deposition (ALD) process. In some embodiments, the spacer layer 80 includes a nitride such as, for example, silicon nitride, silicon boron carbonitride, or silicon oxycarbonitride but exemplary embodiments of the present disclosure are not limited thereto. Rather, the spacer layer 80 may be formed of any suitable dielectric material known in the art for forming gate spacer. In the present embodiment, the spacer layer includes silicon nitride.

Figure 6A:
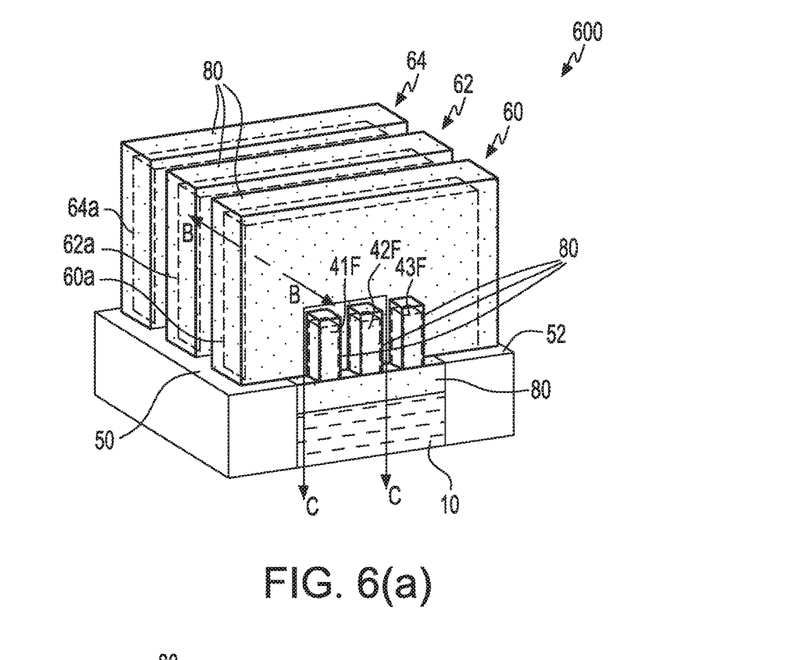
FIG. 6(a) illustrates a perspective view of a first region sixth intermediate structure used in the forming of the first semiconductor structure.
Figure 6B:
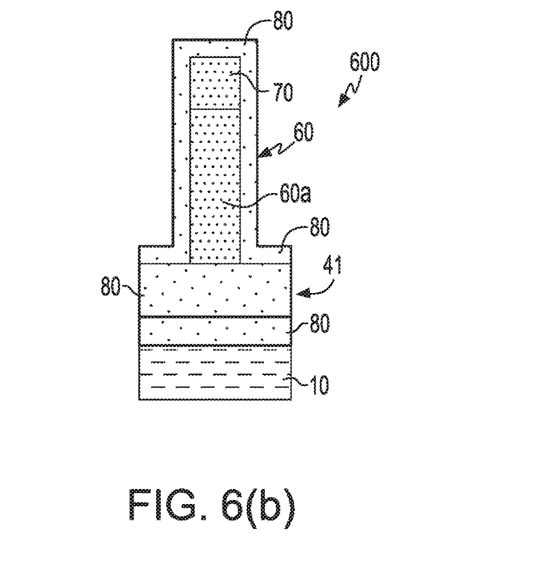
FIG. 6(b) illustrates a cross-sectional view taken along line B-B through the first semiconductor fin and the first gate structure straddling the first semiconductor fin of the first region sixth intermediate structure of FIG. 6(a).
Figure 6C:
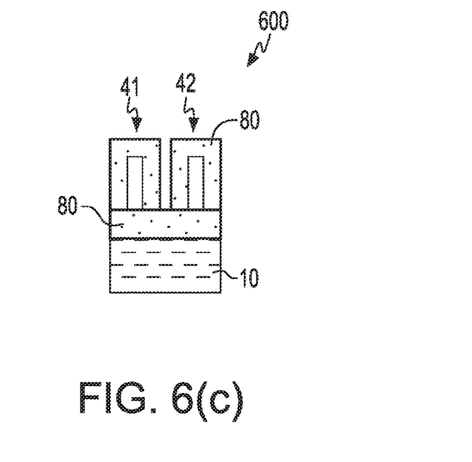
FIG. 6(c) illustrates a cross-sectional view taken along line C-C through the first and second semiconductor fins of the first region sixth intermediate structure of FIG. 6(a) in a region outside of the gate structures.
Figure 7B:
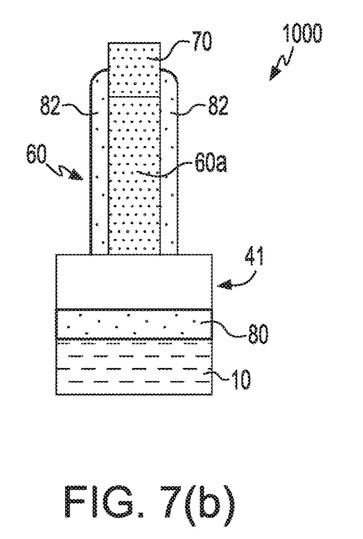
FIG. 7(b) illustrates a cross-sectional view taken along line B-B through the first semiconductor fin and the first gate structure straddling the first semiconductor fin of the first semiconductor structure of FIG. 7(a).
Figure 7C:
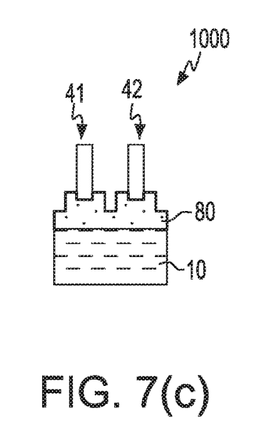
FIG. 7(c) illustrates a cross-sectional view taken along line C-C through the first and second semiconductor fins of the first semiconductor structure of FIG. 7(a) in a region outside of the gate structures.

An etching process is then performed to remove portions of the spacer layer 80 located on the first, second and third hard masks 70, 72, 74, to remove portions of the spacer layer 80 located on of the first, second and third semiconductor fins 41, 42, 43, and to remove a small portion of the spacer layer 80 from the first region space S1 to transform the first region sixth intermediate structure 600 into a first semiconductor structure 1000 shown in FIGS. 7(*a*)-(*c*), and as explained in further detail below. The views illustrated in FIGS. 7(*a*)-(*c*) of the first semiconductor structure 1000 correspond respectively to the same directional views of the first region sixth intermediate structure 600 illustrated in FIGS. 6(*a*)-(*c*), the first region fifth intermediate structure 500 illustrated in 5(*a*)-5(*c*) and the first region fourth intermediate structure 400 illustrated in FIGS. 4(*a*)-(*c*).

Specifically, an anisotropic etching process such as, for example, an RIE process is performed to remove the spacer layer 80 from the top surfaces of each of the first, second and third hard masks 70, 72, 74 and a portion of the spacer layer 80 from the sidewalls of each of the first, second and third hard masks 70, 72, 74 to form a gate spacer 82 on a lower portion of the sidewalls of each the of the first, second and third hard masks 70, 72, 74, and covering substantially the entire sidewalls of each of the first, second and third gate structures 60, 62, 64. The gate spacer 82 laterally surrounds the lower portion of the first, second and third hard masks 70, 72, 74 and laterally surrounds each of the first, second and third gate structures 60, 62, 64.

In addition, portions of the spacer layer 80 are also etched using an RIE process from essentially all surfaces of each of the first, second and third semiconductor fins 41, 42, 43 of the first region sixth intermediate structure 600, except for a lower portion of the sidewalls and the bottom surface of each of the first, second and third semiconductor fins 41, 42, 43. Moreover, almost the entire spacer layer 80 in the first region space S1 remains unetched except for a small portion of the spacer layer 80 that has been etched from the first space region S1 in forming the first semiconductor structure 1000. (See e.g., FIG. 7(*c*)). The first semiconductor structure 1000 is completed after the above-mentioned RIE etching steps. In the first semiconductor structure 1000, the spacer layer 80 still fills in almost all of the portions of the first region space S1 and covers substantially the entire top surface of the first region 1 of the bulk semiconductor substrate 10 thus isolating the first, second, and third semiconductor fins 41, 42, 43 and the first, second and third gate structures 60, 62, 64 from the first region 1 of the bulk semiconductor substrate 10.

As a result of the all of the above-mentioned RIE etching steps performed on the spacer layer 80 of the first region sixth intermediate structure 600 including those RIE etching steps to form the gate spacer 82 and to remove a portion of the spacer layer 80 from the first, second and third semiconductor fins 41, 42 43, the first region sixth intermediate structure 600 is transformed into the first semiconductor structure 1000 illustrated in FIGS. 7(a)-7(c).

After forming the above first semiconductor structure 1000, conventional epitaxial growth processes and doping processes (e.g. ion implantation process) can then be performed to form a source region (not shown) on one of the ends (e.g., first ends 41F, 42F, 43F) of the first, second and third semiconductor fins 41, 42, 43 and a drain region (not shown) on the other end (e.g., second ends 41S, 42S, 43S) of the first, second and third semiconductor fins 41, 42, 43 resulting in the formation of a first FinFET (not shown), a second finFET (not shown) and a third FinFET (not shown) corresponding to the first semiconductor fin 41, the second semiconductor fin 42 and the third semiconductor fin 43, respectively. The portions of the first, second and third semiconductor fins 41, 42, 43 in between the source region and the drain region are known as the channel portions of the first, second and third semiconductor fins 41, 42, 43 of the first, second and third FinFETS, respectively.

Subsequently, after forming the first, second and third FinFETS, the final steps known in the art may then be performed to transform the first semiconductor structure 1000 into a first device which in the present embodiment may be for example, a SRAM device or a logic device.

A second semiconductor structure 1000' is then formed from the second device region 2 of the bulk semiconductor substrate 10. The processes for forming the second semiconductor structure 1000' will be explained with reference to FIGS. 8-11 together with the some of the process steps and drawings for forming the first semiconductor structure 1000, as discussed in further detail below. It is noted that many of the same drawings and description of steps and elements from the method for forming the first semiconductor structure 1000 are applicable to forming the second semiconductor structure 1000' and thus a repetition of the same drawings and description of the same elements will be omitted for the sake of brevity.

The second semiconductor structure 1000' has essentially the same structure as the first semiconductor structure 1000 except that the widths of the gate structures of the second semiconductor structure 1000' are greater than the widths of the first, second and third gate structures of the first semiconductor structure 1000, and the gate structures and semiconductor fins of the second semiconductor structure 1000' are only partially isolated from the bulk semiconductor substrate due to the presence of a remaining portion of the first semiconductor layer (e.g., pillar portion) located in a space below the gate structures and the semiconductor fins as explained in further detail below. Elements in the second semiconductor structure 1000' that are the same as an element of the first semiconductor structure 1000 with be labeled in the specification and the drawings with the same reference numeral as that element of the first semiconductor structure 1000. Furthermore, since the first semiconductor structure 1000 and the second semiconductor structure 1000' have very similar structures to each other except for the above-mentioned differences, an illustration of the entire second semiconductor structure 1000' will not be provided but rather only the structural differences therebetween will be shown in the drawings in connection with the second semiconductor structure 1000' for the sake of brevity.

Firstly, in forming the second semiconductor structure 1000', a second region first intermediate structure (not shown) is provided in the same manner and using the same materials as the first region first intermediate structure 100 set forth in FIG. 1. As mentioned above, the bulk semiconductor substrate 10 includes a first device region 1 and a second device region 2, and the first region first intermediate structure 100 of FIG. 1 includes the first device region 1 of the bulk semiconductor substrate 10. For example, the second region first intermediate structure for forming the second semiconductor structure 1000 includes the second device region 2 of the bulk semiconductor substrate 10. The second region first intermediate structure for forming the second semiconductor structure 1000' further includes a first semiconductor layer 20 and a second semiconductor layer 30 formed on the top surface of the second device region 2 of the bulk semiconductor substrate 10 in the same manner and using the same materials as the first semiconductor layer 20 and the second semiconductor layer 30 of the first region first intermediate structure 100 of FIG. 1.

In the present embodiment, the first semiconductor layer 20 and the second semiconductor layer 30 are sequentially formed on the top surface of the second device region 2 of the bulk semiconductor substrate 10 using, for example, epitaxial growth processes to form the second region first intermediate structure simultaneously with the formation of the first semiconductor layer 20 and the second semiconductor layer 30 on the top surface of the first device region 1 of the bulk semiconductor substrate 10 to form the first region first intermediate structure 1000 illustrated in FIG. 1. In others words, the first region first intermediate structure 100 for forming the first semiconductor structure 1000 and the second region first intermediate structure for forming the second semiconductor structure 1000' may be formed together simultaneously from the same materials, using the same processes and in the same manner as one another.

Alternatively, and in other embodiments the first region first intermediate structure 100 of FIG. 1 and the second region first intermediate structure may be formed at different times from each other and/or from a different substrate.

Further steps in forming the second semiconductor structure 1000' include transforming the second region first intermediate structure into a second region second intermediate structure and then transforming the second region second intermediate structure into a second region third intermediate structure using the same process steps as discussed in connection with forming the first region second intermediate structure 200 and the first region third intermediate structure 300 illustrated in FIGS. 2-3. It is noted that the second region first intermediate structure, the second region second intermediate structure, and the second region third intermediate structure all have identical structures and elements to the first region first intermediate structure 100, the first region second intermediate structure 200, and the first region third intermediate structure 300 illustrated in FIGS. 1-3, respectively except that the second region first intermediate structure, the second region second intermediate structure, and the second region third intermediate structure are formed form the second region 2 of the bulk semiconductor substrate 10 instead of from the first region 1 of the bulk semiconductor substrate 10.

A first gate structure 60' (See FIG. 8), a second gate structure (not shown) and a third gate structure (not shown) are then formed each straddling the top surface and opposing sidewalls of a portion of each of the first semiconductor fin 41, the second semiconductor fin (not shown) and the third semiconductor fin (not shown) at a location in between the first end and the second end of each of the first semiconductor fin 41, the second semiconductor fin and the third semiconductor fin, using a first hard mask 70', a second hard mask (not shown), and third hard mask (not shown) in the same manner and using the same materials as described in connection with forming the first region fourth intermediate structure 400 of FIGS. 4(a)-(c), except that in the second region fourth intermediate structure 400', the first gate structure 60', the second gate structure (not shown) and the third gate structure (not shown) are each formed having a greater width than the widths of the first gate structure 60, the second gate structure 62 and the third gate structure 64 of the first region fourth intermediate structure 400 for forming the first semiconductor structure 1000.

The first gate structure 60', the second gate structure and the third gate structure of the second region fourth intermediate structure for forming the second semiconductor structure 1000' may each have a width of, for example, 50 nm to 2 micron. In addition, the widths of the first hard mask 70, the second hard mask 72, and the third hard mask 74 used to form the first, second and third gate structures 60, 62, 64 of the first region fourth intermediate structure 400 are each less than the widths of the first hard mask 70', the second hard mask and the third hard mask used to form the first gate structure 60', the second gate structure and the third gate structure of the second region fourth intermediate structure 400'.

Figure 8:
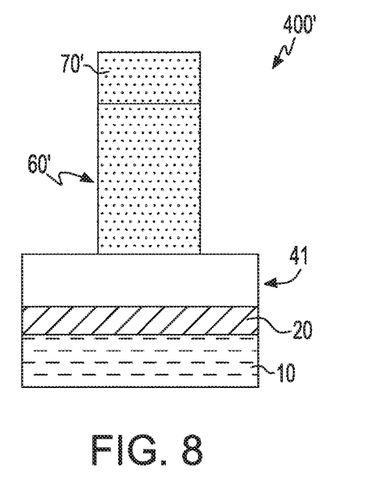
FIG. 8 is a cross-sectional view of a second region fourth intermediate structure used in forming a second semiconductor structure of an exemplary embodiment of the present disclosure along a similar view as that illustrated in FIG. 4(b).

Referring to FIG. 8, this figure is a cross-sectional view though the first semiconductor fin 41 and the first gate structure 60' straddling the first semiconductor fin 41 of the second region fourth intermediate structure 400' similar to the view in FIG. 4(b) of the first region fourth intermediate structure 400, except that widths of the first gate structure 60' and the first hard mask 70' in FIG. 8 are each greater than the widths of the first gate structure 60 and the first hard mask 70 of the first region fourth intermediate structure 400 illustrated in FIG. 4(b). Other than the above-mentioned differences, the first semiconductor layer 20 of the second region fourth intermediate structure 400' fills in substantially the entire area beneath the first semiconductor fin 41, the second semiconductor fin, and the third semiconductor fin and beneath the first gate structure 60', the second gate structure and third gate structure of the second region fourth intermediate structure 400' such that the first semiconductor fin 41, the second semiconductor fin and the third semiconductor fin, the first gate structure 60', the second gate structure and the third gate structure are all prevented from making direct physical contact with the second device region 2 of the bulk semiconductor substrate 10 by the intervening first semiconductor layer 20 in the same fashion as the first semiconductor layer 20 discussed above in connection with the first region fourth intermediate structure 400 illustrated in FIGS. 4(a)-(c). Thus a repeat discussion of the same will be omitted for brevity.

Figure 9:
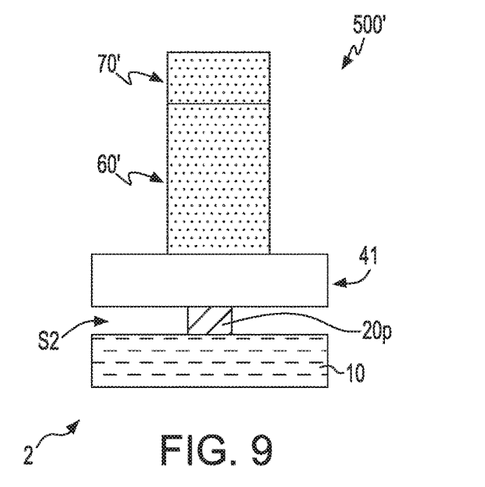
FIG. 9 is a cross-sectional view of a second region fifth intermediate structure along a similar view as that illustrated in FIG. 5(b).

An etching process such as, for example, an RIE process is performed on the first semiconductor layer 20 of the second region fourth semiconductor structure 400' in a similar fashion as the etching of the first semiconductor layer 20 of the first region fourth intermediate structure 400 discussed above in connection with forming the first region fifth intermediate structure 500 illustrated in FIGS. 5(a)-(c), except that unlike the etching process discussed in connection with FIGS. 5(a)-(c), the etching process for forming the second region fifth intermediate structure 500' only partially removes the first semiconductor layer 20 from the second region fourth intermediate structure 400', thus leaving a vertical portion or pillar 20P which constitutes a remaining portion of the first semiconductor layer 20 that has not been etched but rather remains in the second region fifth intermediate structure 500' (See e.g., FIG. 9). For example, as shown in FIG. 9 which is a similar cross-sectional view as FIG. 5(b), the pillar 20P is located in a portion of a second region space S2 beneath a portion of the first semiconductor fin 41 straddled by the first gate structure 60'. The pillar 20P is in direct physical contact with the top surface of the second device region 2 of the bulk semiconductor substrate 10 and in direct physical contact with the bottom surface of a portion of the first semiconductor fin 41 overlapped by the first gate structure 60' as shown in FIG. 9.

Although not illustrated in a cross-sectional view of the drawings, a pillar 20P is also formed in another portion of the second region space S2 beneath a portion of the second semiconductor fin straddled by the first gate structure 60' and in a portion of the second region space S2 beneath a portion of the third semiconductor fin straddled by the first gate structure 60' in the same manner as illustrated in FIG. 9. Furthermore, a pillar 20P is also formed in other portions of the second region space S2 located beneath portions of the first semiconductor fin 41, the second semiconductor fin and the third semiconductor fin which are overlapped by the second gate structure and the third gate structure in the same manner as illustrated in FIG. 9.

In other words, a pillar 20P is formed beneath a channel portion of each of the first semiconductor fin 41, the second semiconductor fin and the third semiconductor fin which are overlapped by the first gate structure 60', the second gate structure and the third gate structure in the same manner as illustrated in FIG. 9. As mentioned above, the portions of the first semiconductor fin 41, the second semiconductor fin and the third semiconductor overlapped by the first gate structure 60', the second gate structure and the third gate structure are known as channel portions of the first semiconductor fin 41, the second semiconductor fin and the third semiconductor fin. Moreover, the height of each of the pillars 20P is the same as the height of the second region space S2.

The location of the pillars 20P from the edges of each of the first gate structure 60', the second gate structure and the third gate structure should greater than 5 nm to avoid leakage junction. Moreover, the pillars 20P provide a heat sink path/heat dissipation path to the second region 2 of the bulk semiconductor substrate 10 to dissipate heat produced by each of the first gate structure 60', the second gate structure, the third gate structure, the first semiconductor fin 41, the second semiconductor fin and the third semiconductor fin.

Other than the above-mentioned portions of the second region space S2 of the second region fifth intermediate structure 500' in which the pillars 20P are located, all of the remaining portions of the second region space S2 are empty in similar fashion as discussed above in connection with the first region fifth intermediate structure 500 illustrated in FIGS. 5(a)-(c) and thus a repeat discussion will be omitted for the sake of brevity.

A spacer layer 80 is then formed over the first hard mask 70', the second hard mask (not shown), the third hard mask (not shown), the first semiconductor fin 41, the second semiconductor fin, the third semiconductor fin, and on the sidewalls of the first gate structure 60', the second gate structure and the third gate structure, and also in the second region space S2 of the second region fifth intermediate structure 500' to transform the second region fifth intermediate structure 500' into a second region sixth intermediate structure 600' in essentially the same manner as discussed above in connection with FIGS. 6(a)-(c) of the method for forming the first region sixth intermediate structure 600, except for a differences mentioned below.

Figure 10:
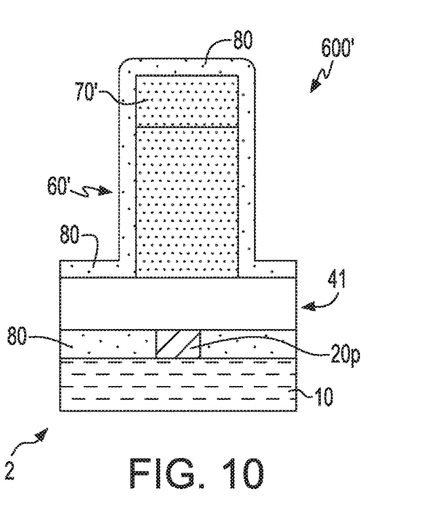
FIG. 10 is a cross-sectional view of a second region sixth intermediate structure along a similar view as that illustrated in FIG. 6(b).

Unlike the first region sixth intermediate structure 600 in FIGS. 6(a)-(c), in the second region sixth intermediate structure 600', the spacer layer 80 does not occupy the entire second region space S2 due to the presence of the pillars 20P in certain portions of second region space S2. Rather, as shown in FIG. 10 which is a cross-sectional view through the first semiconductor fin 41 and the first gate structure 60' straddling the first semiconductor fin 41 of the second region sixth intermediate structure 600' similar to the view of the first region six intermediate structure 600 illustrated in FIG. 6(b), the spacer layer 80 laterally surrounds the pillar 20P in the second region space S2 such that the spacer layer 80 only partially fills the second region space S2, instead of fully filling in second region space S2 as in the first region sixth intermediate structure 600 illustrated in FIGS. 6(a)-(c). In addition, the spacer layer 80 laterally surrounds each of the above-mentioned remaining pillars 20P in the second region space S2 of the second region sixth intermediate structure 600' in the same manner as illustrated in FIG. 10 to fill in all the remaining areas of the second region space S2 which are not occupied by the pillars 20P. An illustration and discussion of the remaining pillars 20P being laterally surrounded by the spacer layer 80 in the second region space S2 has been left out for brevity, as it is clear from the present disclosure and drawings how this is accomplished.

Further, the spacer layer 80 in the second region sixth intermediate structure 600' is in direct physical contact with essentially all of the same portions of the first semiconductor fin 41, the second semiconductor fin and third semiconductor fin in the same fashion as discussed above and illustrated in connection with FIGS. 6(a)-(c), except that in the second region sixth intermediate structure 600' the portions of the bottom surfaces of the first semiconductor fin 41, the second semiconductor fin and the third semiconductor fin which are in direct physical contact with the pillars 20P are not directly contacted by the spacer layer 80. Moreover, the spacer layer 80 in the second region sixth intermediate structure 600' is also in direct physical contact with all of the portions of the bottommost surfaces of the first gate structure 60', the second gate structure, the third gate structure in the active region of the second region sixth intermediate structure 600' in the same fashion as discussed above and illustrated in connection with FIGS. 6(a)-(c).

Processes for transforming the second region sixth intermediate structure 600' into the second semiconductor structure 1000' will be described below. Specifically, an anisotropic etching process such as, for example, an RIE process is then performed on the second region sixth intermediate structure 600' to remove some portions of the spacer layer 80 from the top surfaces and from the side surfaces of each of the first hard mask 70', the second hard mask and the third hard mask, and also to remove some of the spacer layer 80 from the top surfaces and the sidewalls of each of the first semiconductor fin 41, the second semiconductor fin and the third semiconductor fin to form a gate spacer 82 on a lower portion of the sidewalls of each the of the first hard mask 70', the second hard mask and the third hard mask, and covering substantially the entire sidewalls of each of the first gate structure 60', the second gate structure and the third gate structure in essentially the same manner as discussed in connection with the etching process performed on the first region sixth intermediate structure 600 in forming the first semiconductor structure 1000 illustrated in FIGS. 7(a)-(c).

Figure 11:
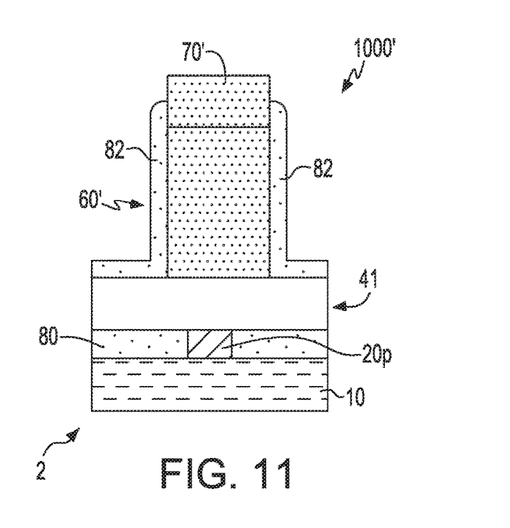
FIG. 11 is a cross-sectional view of a second semiconductor structure along a similar view as that illustrated in FIG. 7(b).

A cross-sectional view of the gate spacer 82 located on the first gate structure 60', and on the first hard mask 70' of the second semiconductor structure 1000' is illustrated in FIG. 11 and this view is a similar view to the cross-sectional view of the first semiconductor structure 1000 illustrated in FIG. 6(b). The gate spacer 82 is also formed on the second gate structure, the third gate structure, the second hard mask and the third hard mask in forming the second semiconductor structure 1000' in essentially the same as discussed above in connection with forming the first semiconductor structure 1000 illustrated in FIGS. 7(a)-(c), and thus a repeat illustration and discussion has been omitted for the sake of brevity.

In addition, portions of the spacer layer 80 are also etched from all surfaces of each of the first semiconductor fin 41, the second semiconductor fin and the third semiconductor fin of the second region sixth intermediate structure 600', except for a lower portion of the sidewalls and the bottom surface of each of the first semiconductor fin 41, the second semiconductor fin, and the third semiconductor fin in the same manner as discussed above in connection with forming the first semiconductor structure 1000 illustrated in FIGS. 7(a)-(c), and thus a repetition of the same will be omitted for the purpose of brevity. Also, a small portion of the spacer layer 80 of the second region sixth intermediate structure 600' has also been etched from the area of the second region space S2 located beneath the portions of the first semiconductor fin 41, the second semiconductor fin, and the third semiconductor fin that are not overlapping with the first gate structure 60', the second gate structure or the third gate structure in a similar fashion as described in connection with FIG. 7(c) in forming the first semiconductor structure 1000.

In addition, and in forming the second semiconductor structure 1000', the portions of the spacer layer 80 laterally surrounding the pillars 20P in the second region space S2 are not etched from the second region sixth intermediate structure 600' but rather the spacer layer 80 remains laterally surrounding each of the pillars 20P as illustrated in FIG. 11.

As a result of the above-mentioned RIE etching steps performed on the spacer layer 80 of the second region sixth intermediate structure 600' to form the gate spacer 82 and to remove portions of the spacer layer 80 from the first semiconductor fin 41, the second semiconductor fin and the third semiconductor fin, the second region sixth intermediate structure 600' is transformed into the second semiconductor structure 1000' illustrated in FIG. 11.

After forming the above second semiconductor structure 1000', conventional epitaxial growth processes and doping processes (e.g. ion implantation process) can then be performed to form a source region and a drain region on the first semiconductor fin 41, the second semiconductor fin and the third semiconductor fin resulting in the formation of Fin-FETs (not shown) in the same manner discussed above in connection with the first semiconductor structure 1000.

Subsequently, after forming the FinFETS, the final steps known in the art may then be performed to transform the second semiconductor structure 1000' into a second device which in the present embodiment may be for example, an analog device such as an analog radio frequency (RF) device.

As noted above, the first semiconductor structure 1000 and the second semiconductor structure 1000' have substantially identical structures as one another, except that the widths of the gate structures and hard masks in the second semiconductor structure 1000' are greater than the widths of the gate structures and hard masks in the first semiconductor structure 1000, and in the second semiconductor structure 1000' a portion of the first semiconductor layer remains as a pillar in the space located between the top surface of the bulk semiconductor substrate and the bottom surfaces of the semiconductor fins and the bottom surfaces of the gate structures instead of that space being completely filled by a dielectric spacer material (e.g., a spacer layer) as in the first semiconductor structure 1000.

With exemplary embodiments of the present invention, a first device and a second device can be formed on a same bulk semiconductor substrate. The first device may be a relatively small device such as, for example, a SRAM or logic device in which the semiconductor fins and the gate structures are fully isolated from the bulk semiconductor substrate by a spacer layer formed of a dielectric material, and the second device may be a larger device such as, for example, an RF analog device in which the semiconductor fins and the gate structures are only partially isolated from the bulk semiconductor substrate by a spacer layer formed of a dielectric material due to the presence of a vertical portion or pillar formed of semiconductor material contacting the top surface of the bulk semiconductor substrate and the bottom surface of the semiconductor fins. Therefore, with first device (e.g., SRAM or logic device) heat from the gate structures and the semiconductor fins may not be dissipated to the bulk semiconductor substrate. However, with the second device since the gate structures and the semiconductor fins are only partially isolated from the bulk semiconductor substrate, the heat produced by the high input and output current generated by the gate structures may be dissipated to the bulk semiconductor substrate via the pillar. Thus, the pillar formed of a semiconductor material in the second device provides a heat sink path to the bulk semiconductor substrate.

While the present application has been described in terms of specific embodiments, it is evident in view of the foregoing description that numerous alternatives, modifications and variations will be apparent to those skilled in the art. Each of the various embodiments of the present application can be implemented alone, or in combination with any other embodiments of the present application unless expressly disclosed otherwise or otherwise impossible as would be known to one of ordinary skill in the art. Accordingly, the present application is intended to encompass all such alternatives, modifications and variations which fall within the scope and spirit of the present application and the following claims.

What is claimed is:

1. A semiconductor device comprising:
   a first plurality of semiconductor fins spaced apart from each other and located on a first region of a bulk semiconductor substrate;
   at least one first region gate structure straddling over a portion of the first plurality of semiconductor fins;
   at least one vertical semiconductor material portion located in a first region space located between a top surface of the first region of the bulk semiconductor substrate and a bottom surface of the first plurality of semiconductor fins and a bottom surface of the at least one first region gate structure, wherein the at least one vertical semiconductor material portion provides a heat dissipation path from the at least one first region gate structure and at least one of the first plurality of semiconductor fins to the first region of the bulk semiconductor substrate;
   a first dielectric layer filling in the first region space and laterally surrounding the at least one vertical semiconductor material portion in the first region space such that the first plurality of semiconductor fins and the at least one first region gate structure are partially isolated from the bulk semiconductor substrate by the first dielectric layer;
   a first shallow trench isolation (STI) trench covering a first sidewall of the first region of the bulk semiconductor substrate and a first sidewall of the first dielectric layer located on the top surface of the first region of the bulk semiconductor substrate;
   a second STI trench covering a second sidewall of the first region of the bulk semiconductor substrate and a second sidewall of the first dielectric layer located on the top surface of the first region of the bulk semiconductor substrate, wherein the at least one first region gate structure extends onto a portion of an upper surface of the first STI trench and onto a portion of an upper surface of the second STI trench, and wherein the at least one vertical semiconductor material portion extends from the first STI trench to the second STI trench; and
   a first gate spacer located on opposing sidewalls of the at least one first region gate structure.

2. The semiconductor device of claim 1, wherein the at least one vertical semiconductor material portion directly contacts the bottom surface of the at least one of the first plurality of semiconductor fins and the top surface of the first region of the bulk semiconductor substrate.

3. The semiconductor device of claim 1, wherein the first dielectric layer has a top surface that is coplanar with a top surface of the at least one vertical semiconductor material portion.

4. The semiconductor device of claim 1, wherein the at least one vertical semiconductor material portion is located beneath a channel portion of each semiconductor fin of the first plurality of semiconductor fins.

5. The semiconductor device of claim 1, wherein a height of the at least one vertical semiconductor material portion is equal to a height of the first dielectric layer.

6. The semiconductor device of claim 1, wherein the at least one vertical semiconductor material portion is pillar shaped.

7. The semiconductor device of claim 1, wherein the at least one vertical semiconductor material portion is located greater than 5 nm from an edge of the at least one first region gate structure.

8. The semiconductor device of claim 1, wherein the at least one vertical semiconductor material portion has a length that is less than a length of the first plurality of semiconductor fins.

9. The semiconductor device of claim 1, wherein the first region of the bulk semiconductor substrate includes silicon, wherein the at least one vertical semiconductor material portion includes one of silicon germanium (SiGe) or indium phosphide (InP), and wherein the first plurality of semiconductor fins includes one of silicon or indium arsenide (InAs).

10. The semiconductor device of claim 1, further comprising:
   a second plurality of semiconductor fins located on a second region of the bulk semiconductor substrate;
   at least one second region gate structure straddling over a portion of the second plurality of semiconductor fins;

a second dielectric layer filling in a second region space between a top surface of the second region of the bulk semiconductor substrate and a bottom surface of the second plurality of semiconductor fins and a bottom surface of the at least one second region gate structure such that the second plurality of semiconductor fins and the at least one second region gate structure are fully isolated from the second region of the bulk semiconductor substrate by the second dielectric layer; and a second gate spacer located on opposing sidewalls of the at least one second region gate structure, and wherein the at least one second region gate structure has a width that is smaller than a width of the at least one first region gate structure.

11. The semiconductor device of claim 10, wherein the second region of the bulk semiconductor substrate includes silicon, and wherein the second plurality of semiconductor fins include one of silicon or indium arsenide (InAs).

12. The semiconductor device of claim 10, wherein the width of the at least one first region gate structure is in a range from 500 nm to 1 micron, wherein the width of the at least one second region gate structure is in a range from 5 nm to 100 nm.

13. The semiconductor device of claim 10, wherein a lengthwise direction of the first plurality of semiconductor fins is perpendicular to a lengthwise direction of the at least one first region gate structure, and wherein a lengthwise direction of the second plurality of semiconductor fins is perpendicular to a lengthwise direction of the at least one second region gate structure.

14. The semiconductor device of claim 10, further comprising:

a third STI trench covering a first sidewall of the second region of the bulk semiconductor substrate and a first sidewall of the second dielectric layer located on the top surface of the second region of the bulk semiconductor substrate; and a fourth STI trench covering a second sidewall of the second region of the bulk semiconductor substrate and a second sidewall of the second dielectric layer located on the top surface of the second region of the bulk semiconductor substrate, wherein the at least one second region gate structure extends onto a portion of an upper surface of the third STI trench and onto a portion of an upper surface of the fourth STI trench.

* * * * *